(12) United States Patent
Rousseau

(10) Patent No.: US 10,788,661 B2
(45) Date of Patent: Sep. 29, 2020

(54) PROJECTOR CONFIGURED TO PROJECT AN IMAGE TOWARDS A SURFACE REFLECTING LIGHT TOWARDS AN EYE OF A USER AND PORTABLE DEVICE COMPRISING SUCH PROJECTOR

(71) Applicant: Essilor International, Charenton-le-Pont (FR)

(72) Inventor: Denis Rousseau, Charenton-le-Pont (FR)

(73) Assignee: Essilor International, Charenton-le-Pont (FR)

(*) Notice: Subject to any disclaimer, the term of this patent is extended or adjusted under 35 U.S.C. 154(b) by 0 days.

(21) Appl. No.: 16/098,294

(22) PCT Filed: Aug. 7, 2017

(86) PCT No.: PCT/EP2017/069905
§ 371 (c)(1),
(2) Date: Nov. 1, 2018

(87) PCT Pub. No.: WO2018/029135
PCT Pub. Date: Feb. 15, 2018

(65) Prior Publication Data
US 2019/0137757 A1 May 9, 2019

(30) Foreign Application Priority Data
Aug. 8, 2016 (EP) .................................... 16306029

(51) Int. Cl.
*G02B 26/10* (2006.01)
*G02B 26/08* (2006.01)
(Continued)

(52) U.S. Cl.
CPC .............. *G02B 26/105* (2013.01); *B81B 7/02* (2013.01); *G02B 26/0833* (2013.01);
(Continued)

(58) Field of Classification Search
CPC .............. G02B 26/105; G02B 27/0172; G02B 26/0833; G02B 2027/0178; H04N 9/3144;
(Continued)

(56) References Cited

U.S. PATENT DOCUMENTS

| 5,614,961 A | 3/1997 | Gibeau et al. |
| 5,715,021 A | 2/1998 | Gibeau et al. |

(Continued)

FOREIGN PATENT DOCUMENTS

WO     WO 2008/010651 A1     1/2008

OTHER PUBLICATIONS

International Search Report and Written Opinion of the International Searching Authority dated Nov. 2, 2017 in PCT/EP2017/069905 filed Aug. 7, 2017.

*Primary Examiner* — Michelle M Iacoletti
*Assistant Examiner* — Danell L Owens
(74) *Attorney, Agent, or Firm* — Oblon, McClelland, Maier & Neustadt, L.L.P.

(57) ABSTRACT

A projector configured to be embedded into a portable device and to project an image towards a surface reflecting light towards an eye of a user, the projector including: a linear array of light sources emitting a light beam, the linear array of light sources emitting at least a first wavelength and extending in a first direction; a scanner configured to move the light beam on a second direction transverse to the first direction to display the image; a controller controlling the scanner and the light sources of the linear array.

11 Claims, 3 Drawing Sheets

(51) Int. Cl.
*H04N 9/31* (2006.01)
*G02B 27/01* (2006.01)
*H04N 3/08* (2006.01)
*B81B 7/02* (2006.01)
*G03B 21/20* (2006.01)

(52) U.S. Cl.
CPC ....... *G02B 27/0172* (2013.01); *G03B 21/204* (2013.01); *H04N 3/08* (2013.01); *H04N 9/3129* (2013.01); *H04N 9/3138* (2013.01); *H04N 9/3144* (2013.01); *H04N 9/3173* (2013.01); *B81B 2201/042* (2013.01); *G02B 2027/0178* (2013.01)

(58) Field of Classification Search
CPC ...... H04N 9/3173; H04N 9/3129; H04N 3/08; B81B 2201/042
See application file for complete search history.

(56) References Cited

U.S. PATENT DOCUMENTS

| | | | |
|---|---|---|---|
| 5,920,361 A | 7/1999 | Gibeau et al. | |
| 6,628,248 B2* | 9/2003 | Masumoto | H05B 45/22 345/32 |
| 2004/0026514 A1 | 2/2004 | Yavid et al. | |
| 2012/0188519 A1 | 7/2012 | Willett et al. | |
| 2013/0321814 A1* | 12/2013 | Zhan | G01N 21/59 356/432 |
| 2015/0126857 A1 | 5/2015 | Choi et al. | |
| 2015/0243068 A1* | 8/2015 | Solomon | G02B 27/017 345/419 |
| 2015/0260995 A1* | 9/2015 | Mukawa | G02B 27/0172 345/8 |
| 2016/0381832 A1* | 12/2016 | Hurbi | G02B 27/0176 165/185 |
| 2017/0299869 A1* | 10/2017 | Urey | A61B 3/032 |

* cited by examiner

PROJECTOR CONFIGURED TO PROJECT AN IMAGE TOWARDS A SURFACE REFLECTING LIGHT TOWARDS AN EYE OF A USER AND PORTABLE DEVICE COMPRISING SUCH PROJECTOR

FIELD OF THE INVENTION

The inventions relates to a projector configured to be embedded into a portable device and to project an image towards a surface reflecting light towards an eye of a user. The invention further relates to a portable device comprising such projector.

BACKGROUND OF THE INVENTION

Usually, a micro-display intended to be embedded into a portable device, such as a mobile phone or a head mounted device, comprises a matrix of light sources with micron size pixels.

It exists micro-displays comprising a laser source or a light-emitting diode (LED), or three laser sources or LEDs in order to make a colored image, and a microelectromechanical system (MEMS). The MEMS is configured to receive the light emitted by the LED or the laser source and to scan the surface of the eye of the user of the portable device. Such micro-display have a high level of luminosity, but generally require complex laser source and complex optical design.

Moreover, with a micro-display having low luminance, readability problems may occur, especially for augmented reality applications when the luminance of the environment of the wearer is at a high level.

Additionally, if the luminance of the display is set to a high value, the temperature of the elements of the display increases, which causes heat dissipation problems, and may cause a discomfort for the user of the portable device, in particular when the micro-display is embedded into a lens of a head mounted device.

It exists organic light-emitting diode (OLED) displays having a low luminance, liquid crystal displays (LCDs), liquid crystal on silicon (LCOS) sequential color displays and LCOS filter color displays. The LCOS filter color displays comprise one LED, whereas the LCOS sequential color displays comprise three LEDs. Such displays generally have a better luminance than the OLED displays, for instance about 2 kcd/m$^2$ or less. However, since the LCOS sequential color displays comprise three LEDs, it requires more space in order to fit the LEDs into a portable device, for instance into a lens of a head mounted device. Moreover, such micro-displays generally require a complex optical guide, especially for augmented reality application, where the optical guide need to be transparent to enable a see-through vision of the user. Additionally, a LCD need one or several LED(s) backlight in order to reflect the light of the LEDs, which require more space in order to fit the display into a lens of a head mounted device. Hence, both the OLED and LCOS displays have a matrix shape and components too large to fit into a portable device easily. Thus, such micro-displays are usually placed on a temple of the head mounted device, with an optical guide to transmit the image to be projected to the eye of the user.

It also exists, micro-light-emitting diode (micro-LED) displays having a high luminosity, for instance about 6000 kcd/m$^2$, and a pixel size of about 10 to 20 µm. However, a matrix comprising such micro-LED technology presents heat transfer problems. Moreover, the micro-LED displays have the same size than the OLED and LCOS displays, and thus, such displays are difficult to be integrated into lenses.

Hence, there is a need for a linear display array of light sources and a projector configured to project the linear array successively at different positions to display a matrix image.

One object of the invention is to provide such projector and linear display array of light sources.

SUMMARY OF THE INVENTION

To this end, the invention proposes a projector configured to be embedded into a portable device and to project an image towards a surface reflecting light towards an eye of a user or towards an eye of the user, the projector comprising:
  a linear array of light sources emitting a light beam, the linear array of light sources emitting at at least a first wavelength and extending in a first direction;
  a scanning mean configured to move the light beam on a second direction transverse to the first direction to display the image;
  a control unit for controlling the scanning mean and the light sources of the linear array.

Advantageously, the projector according to the invention may easily be embedded into a portable device, such as a mobile phone or a head mounted device. Additionally, the linear array of light sources allows reducing the general size of the projector, and thus allows facilitating the projector to be embedded into a portable device, for instance into a head mounted device placed in front of the eye of a user.

Moreover, with the linear array of light sources and the scanning mean, the heat dissipation is reduced.

According to embodiments, the projector according to the invention may further comprise one or several of the following features according to any possible combination:
  the scanning mean comprises a reflecting optic configured to direct the light beam towards a surface reflecting light towards an eye of the user or towards an eye of the user, the reflecting optic being movable by rotation such that the rotation of the reflecting optic causes the movement of the light beam according to the second direction to display the image; and/or
  the scanning mean comprises a controllable liquid optic controlled by the control unit and configured to direct the light beam to display the image; and/or
  the scanning mean comprises a support configured to support the linear array of light sources and being movable by rotation such that the rotation of the support causes the movement of the light beam according to the second direction to display the image; and/or
  the projector further comprises a light conducting element arranged and configured to guide the light beam emitted by the light sources of the linear array towards the reflecting optic or the controllable liquid optic; and/or
  the scanning mean comprises at least a microelectromechanical system (MEMS); and/or
  the projector further comprises a heat dissipator; and/or
  the linear array comprises a first line matrix of light sources emitting at a first wavelength, a second line matrix of light sources emitting at a second wavelength and a third line matrix of light sources emitting at a third wavelength, the line matrix of light sources being arranged along the other ones, the first, second and third wavelengths being different one from the other; and/or
  the first line matrix comprises red diodes, the second line matrix comprises blue diodes and the third line matrix comprises green diodes; and/or the linear array comprises one line matrix of light sources emitting at one wavelength; and/or the first line matrix comprises red diodes or blue diodes or green diodes; and/or the linear array comprises one line matrix of light sources emitting at a first, a second and a third wavelengths, the first, second and third wavelengths being different one from the other; and/or the first line matrix comprises red diodes and blue diodes and green diodes; and/or the linear array comprises a first line matrix of light sources emitting at a first and a second wavelengths, a second line matrix of light sources emitting at a second and a third wavelengths, the line matrix of light sources being arranged along the other one, the first, second and third wavelengths being different one from the other; and/or the first line matrix comprises red diodes and green diodes, and the second line matrix comprises blue diodes and green diodes.

The invention further relates to a portable device comprising at least a projector for projecting an image towards a surface reflecting light towards an eye of a user or towards an eye of the user according to the invention.

Advantageously, a portable device of the invention allows improving the comfort of the user of the portable device, especially thanks to the reduction of the heat dissipation of the projector embedded into the portable device and thanks to the reduction of the dimensions of such projector.

According to embodiments, the portable device according to the invention may further comprise one or several of the following features according to any possible combination:

the portable device is a mobile phone; and/or the portable device is a head mounted device comprising at least an optical system designed to be placed in front of the eye of the user and having a back face, the projector being embedded into the optical system such that the image projected by the projector is transmitted through the back face towards the eye of the user; and/or the projector is arranged such that the linear array extends horizontally or vertically into the optical system; and/or the optical system is an ophthalmic lens intended to be worn by the user, the ophthalmic lens being adapted to the user; and/or the optical system is an ophthalmic lens intended to be worn by the user, the ophthalmic lens being adapted to the user's prescription; and/or one of the at least a projector is arranged in a lower part of the ophthalmic lens and configured to project the image towards the eye with a focus tuned for near vision and/or one of the at least a projector is arranged in an upper part of the ophthalmic lens and configured to project the image towards the eye with a focus tuned for far vision.

Unless specifically stated otherwise, as apparent from the following discussions, it is appreciated that throughout the specification discussions utilizing terms such as "computing", "calculating", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer or Digital Signal Processor ("DSP") selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions, and capable of being coupled to a computer system bus.

In addition, embodiments of the present invention are not described with reference to any particular programming language. It will be appreciated that a variety of programming languages may be used to implement the teachings of the inventions as described herein.

BRIEF DESCRIPTION OF THE DRAWINGS

Other characteristics and advantages of the invention will become more apparent from the claims and from the following description of some embodiments given by way of example without limitation with reference to the drawings, in which:

Elements in the figures are illustrated for simplicity and clarity and have not necessarily been drawn to scale. For example, the dimensions of some of the elements in the figure may be exaggerated relative to other elements to help improve the understanding of the embodiments of the present invention.

DETAILED DESCRIPTION OF PREFERRED EMBODIMENTS

The invention relates to a projector intended to be embedded into a portable device, such as a mobile phone or a head mounted device.

The projector is configured to project an image towards a surface reflecting light towards an eye of a user. The projector may further project an image directly towards an eye of a user.

The projector is preferably a micro-projector.

Figure 1:
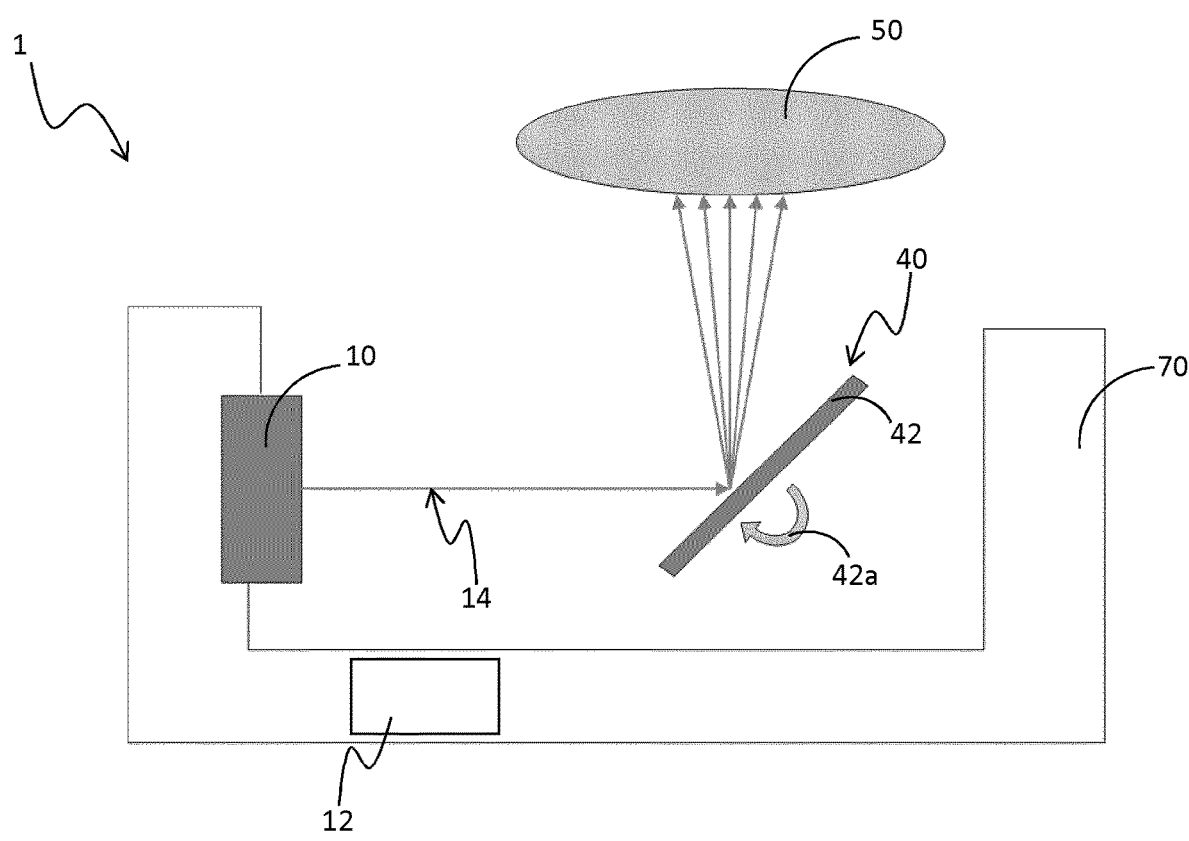
FIG. 1 represents a projector according to an embodiment of the invention.

A projector according to an embodiment of the invention is represented in FIG. 1. The projector 1 comprises a linear array 10 of light sources, a scanning mean 40 and a control unit 12.

The linear array 10 of light sources extends in a first direction and is configured to emit a light beam 14.

The scanning mean 40 is configured to move the light beam 14 on a second direction transverse to the first direction to display the image. More precisely, the light beam 14 is redirected by the scanning mean 40 on a second direction. The scanning mean 40 allows displaying the image towards a surface 50 reflecting light towards an eye of a user, or directly towards an eye of a user.

The control unit 12 is configured to control the scanning mean 40 and the light sources of the linear array 10.

The projector may be a single piece projector. More precisely, in a single piece projector, the light beam 14 emitted by the light sources of the linear array 10 is directly redirected by the scanning mean 40 so as to display the image.

The projector may be a double piece projector. In particular, in a double piece projector, the light beam 14 emitted by the linear array 10 of light sources is guided towards the scanning mean 40, for instance with an optical guide. In other words, the linear array 10 and the scanning mean 40 may be separated by an optical guide.

Figure 2A:
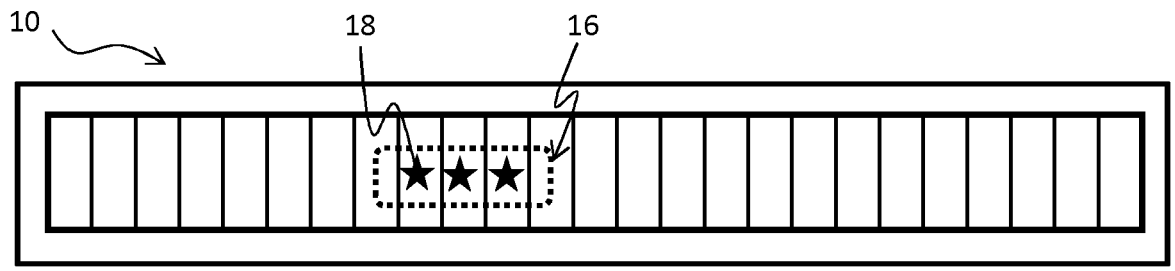
FIGS. 2*a* to 2*d* represent linear arrays of light sources according to embodiments of the invention.

According to an embodiment of the invention represented in FIG. 2a, the linear array 10 may comprise one line matrix 16 of light sources extending in a first direction and emitting at a first wavelength. In other words, the linear array is a single color array of light sources aligned along a first direction.

Advantageously, the first wavelength is comprised in the visible spectrum, namely between 400 nm and 700 nm. With such linear array 10, the image projected by the projector 1 is a monochrome image.

The line matrix 16 may comprise laser diodes or micro-LEDs 18. The diodes 18 may be red, or blue, or green diodes.

The line matrix 16 may comprise a plurality of diodes, depending on the size and the resolution of the image to be projected. For instance, a line matrix may comprise 2048 micro-LEDs. Each micro-LED may be about 10 μm, namely a line matrix may be about 20.48 mm wide. Advantageously, such line matrix is sized small enough to fit into a mobile phone or into a lens of a head mounted device easily.

Figure 2B:
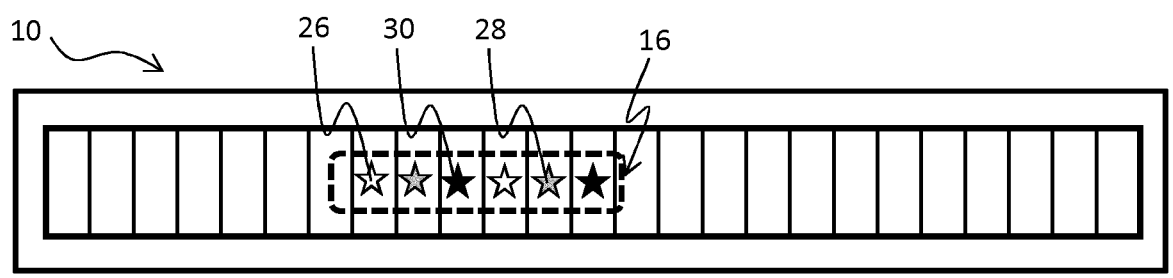

According to an embodiment of the invention represented in FIG. 2b, the linear array 10 may comprise one line matrix 16 of light sources emitting at a first, a second and a third wavelengths, the first, second and third wavelengths being different one from the other.

As illustrated in FIG. 2b, the line matrix 16 may comprise red diodes 26, blue diodes 28 and green diodes 30.

Such configuration allows obtaining a colored image.

Figure 2C:
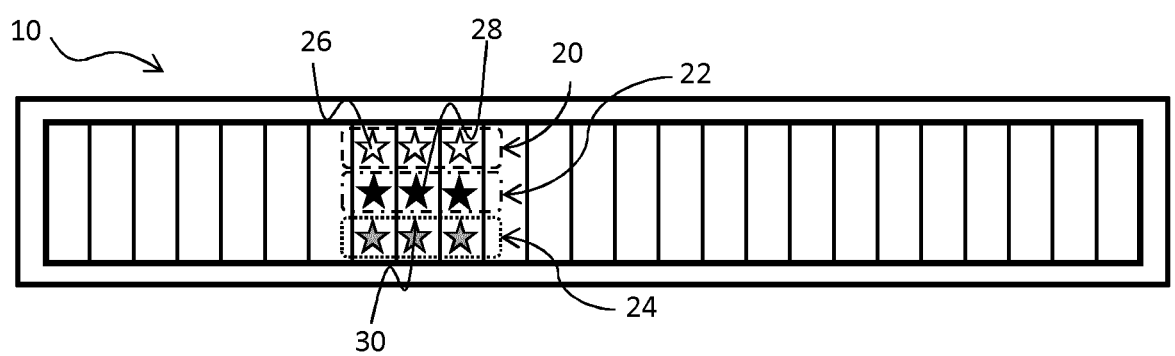

According to another embodiment of the invention represented in FIG. 2c, the linear array 10 may comprise a first line matrix 20 of light sources, a second line matrix 22 of light sources and a third line matrix 24 of light sources.

The line matrix are preferably arranged along the other ones. In other words, the first line matrix 20, the second line matrix 22 and the third line matrix 24 are aligned one beside the other ones.

In particular, the first line matrix 20 emits at a first wavelength, the second line matrix 22 emits at a second wavelength and the third line matrix 24 emits at a third wavelength, with the first, second and third wavelengths different one from the other. Advantageously, the first, second and third wavelengths may be comprised in the visible spectrum. Preferably, a difference of wavelength between each of the first, second and third wavelengths is greater than 30 nm [to be confirmed by the inventors]. In other words, with such linear array 10, when the first, second and third wavelengths correspond to the red, blue and green colors, the image projected by the projector 1 is a colored image.

As represented in FIG. 2c, the first line matrix 20 may comprise red diodes 26, the second line matrix 22 may comprise green diodes 30 and the third line matrix 24 may comprise blue diodes 28. Of course, the first, second and third line array may be interchanged. Generally, the first, second and third lines matrix comprise the same number of light sources, so as to project an image without errors.

The first, second and third line matrix may comprise micro-LEDs. For instance, the height of the three lines of micro-LEDs may be about 30 μm. Advantageously, such lines matrix is sized small enough to fit into a mobile phone or into a head mounted device easily.

According to an embodiment of the invention, the first line matrix of light sources may be turned on, and then the second line matrix of light sources may be turned on, and then the third line matrix of light sources may be turned on. Each line matrix may be scanned by the scanning means.

Figure 2D:
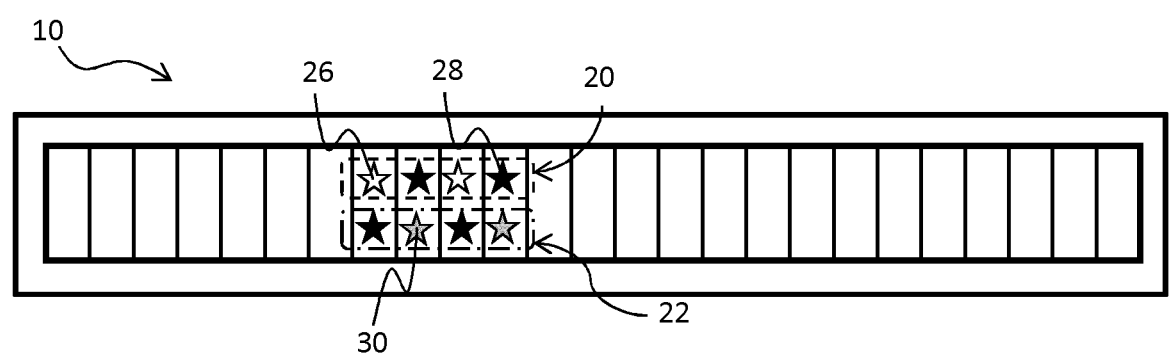

According to another embodiment of the invention represented in FIG. 2d, the linear array 10 of light sources may comprise a first line matrix 20 of light sources emitting at a first and a second wavelengths, and a second line matrix 22 of light sources emitting at a second and a third wavelengths, with the first, second and third wavelengths different one from the other. The line matrix of light sources being arranged along the other one.

As illustrated in FIG. 2b, the first line matrix 20 may comprise red diodes 26 and green diodes 30, and the second line matrix 22 may comprise blue diodes 28 and green diodes 30. Of course, the first and second lines matrix may comprise any combination of diodes comprising red, blue, green or white diodes.

According to an embodiment illustrated in FIG. 1, the scanning mean 40 may comprise a reflecting optic 42 configured to direct the light beam 14 towards a surface 50 reflecting light towards an eye of the user. In particular, the reflecting optic 42 may be movable by rotation, the rotational movement being represented by the arrow 42a. The rotation of the reflecting optic 42 causes the movement of the light beam 14 according to the second direction to display the image.

The reflecting optic may be, for example, a reflecting mirror.

According to a further embodiment, the scanning mean 40 may comprise a microelectromechanical system (MEMS) configured to direct the light beam 14 towards a surface 50 reflecting light towards an eye of the user.

The reflecting optic 42 may comprise the MEMS. Advantageously, the scanning mean 40 comprising a reflecting mirror, the reflecting mirror being a MEMS, the projector presents a thin thickness.

According to a further embodiment, the scanning mean 40 may comprise a controllable liquid optic configured to direct the light beam 14 to display the image. The controllable liquid optic is preferably controlled by the control unit 12. More precisely, the controllable liquid optic is controlled with an electric field. The controllable liquid optic is designed so as to cover the linear array and to direct the light beam in the second direction.

According to a further embodiment, the scanning mean 40 may comprise an electro-active optic configured to direct the light beam 14 to display the image. The electro-active optic is preferably controlled by the control unit 12.

Figure 3:
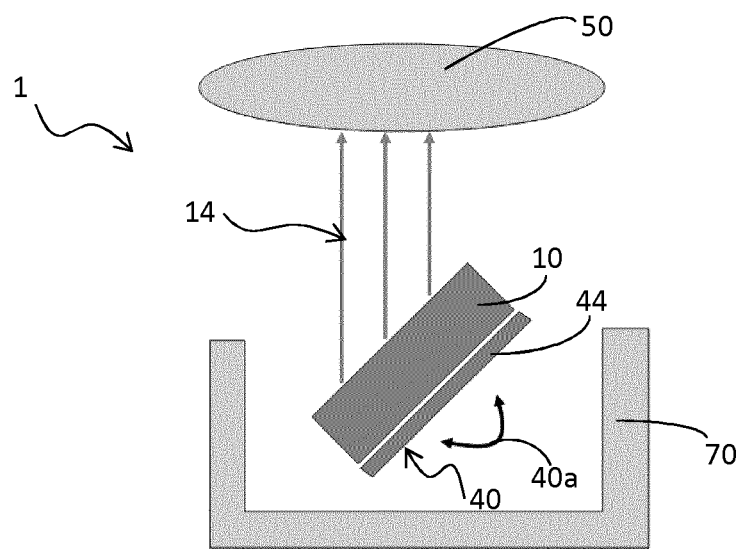
FIG. 3 represents a projector according another embodiment of the invention.

According to a further embodiment illustrated in FIG. 3, the scanning mean 40 may comprise a support 44 configured to support the linear array 10 of light sources. The support 44 is movable by rotation, the rotational movement being represented by the arrow 44a. The rotation of the support 44 causes the movement of the light beam 14 according to the second direction to display the image. More precisely, the rotation of the support 44 causes the rotation of the linear array 10 of light sources, so that the light beam 14 emitted by the light sources of the linear array 10 display the image.

The support 44 is advantageously designed with a shape similar to the shape of the linear array 10.

The scanning mean 40 may further comprise an optical element configured to direct the light beam 14 into the second direction to display the image. The scanning mean 40, the linear array 10 and the optical element are movable together in rotation to direct the light beam 14 into the second direction so as to display the image.

According to a further embodiment of the invention, the projector 1 may comprise a light conducting element arranged and configured to guide the light beam 14 emitted by the light sources of the linear array 10 towards the scanning mean 40, and more precisely towards the reflecting optic 42 or towards the controllable liquid optic.

Figure 4:
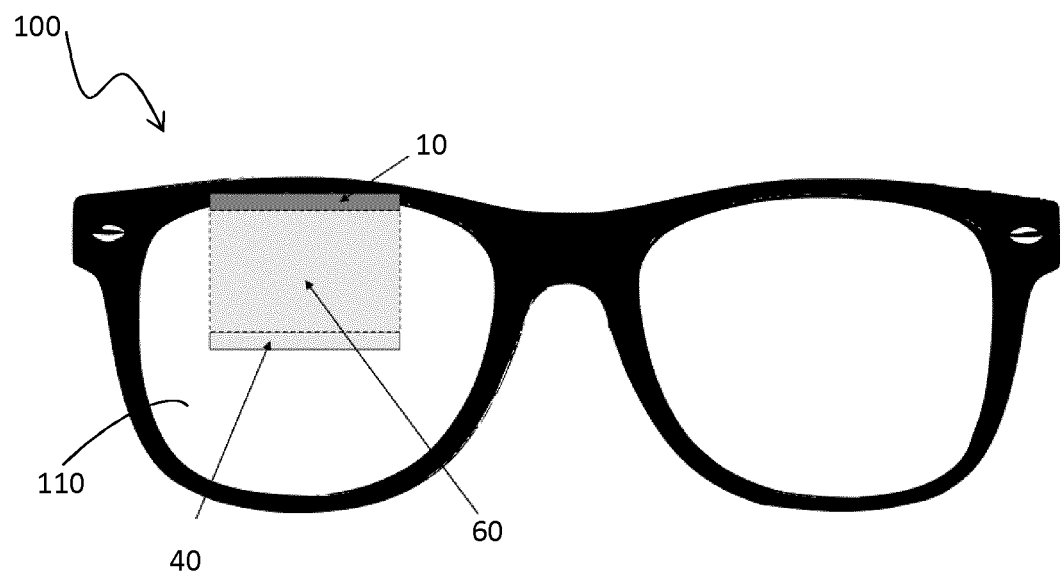
FIG. 4 represents a portable device comprising a projector according to an embodiment of the invention.

The light conducting element 60, represented in FIG. 4, may be a transparent optical guide.

In this embodiment, the projector 1 is a double piece projector. The linear array 10 is separated from the scanning mean 40 by the light conducting element 60.

The projector 1 may further comprise a focusing optic for focusing the light beam guided by the light conducting element at a predetermined distance. For instance, the focusing optic may be arranged to receive the light beam and to focus it on the scanning means 40.

According to a further embodiment of the invention, the projector 1 may comprise a mechanical support 70.

The mechanical support 70 is configured to support the linear array 10, the scanning mean 40 and the control unit 12.

The projector 1 may further comprise a heat dissipator. Preferably, the mechanical support 70 comprises the heat dissipator. The heat dissipator allows reducing the temperature of the projector 1, especially when the linear array 10 comprises micro-LEDs.

Advantageously, the heat dissipator is about 2 mm or less, so that the projector 1 may be embedded easily in a lens of a head mounted device.

The invention further relates to a portable device comprising a projector for projecting an image towards a surface reflecting light towards an eye of a user as described previously. In other words, the projector of the invention may be embedded into a portable device.

The portable device is intended to be worn by a user.

For instance, the portable device may be a mobile phone to project an image on a flat surface.

The portable device may further be a head mounted device.

For example, the projector may be embedded into an augmented reality equipment, such as augmented reality lenses with a transparent optical guide.

As another example, the projector may be embedded into a virtual reality equipment comprising a linear array adapted to give a very large field of view. For instance, the linear array may comprise 8000 micro-LEDs and extend over 80 mm wide.

As represented in FIG. 4, the portable device is a head mounted device 100, a more precisely a pair of spectacle lenses.

The terms "upper", "lower", "horizontal", "vertical", "temporal side" and "nasal side" are to be understood in wearing conditions of the head mounted device 100, namely such terms indicate relative position of the head mounted device 100 when it is worn by a user.

The head mounted device 100 may comprise a frame and an optical system 110 designed to be placed in front of the eye of a user.

The optical system 110 may be an optical lens, or an ophthalmic lens, intended to be worn by the user. Preferably, the ophthalmic lens is adapted to the user, or to the user's prescription.

The optical system 110 generally have a back face. The projector 1 may be embedded into the optical system 110 such that the image projected by the projector 1 is transmitted through the back face of the optical system 110 towards the eye of the user.

According to an embodiment of the invention, the projector 1 may be arranged such that the linear array 10 extends horizontally into the optical system 110. Advantageously, a linear array 10 extending horizontally into the optical system 110 is placed along the upper edge or the lower edge of the optical system 110.

Alternatively, the projector 1 may be arranged such that the linear array 10 extends vertically into the optical system 110. Advantageously, a linear array 10 extending vertically into the optical system 110 is placed along the nasal edge or the temporal edge of the optical system 110.

According to an embodiment of the invention, the projector 1 may be arranged in a lower part of the ophthalmic lens 110. In particular, in such embodiment, the projector 1 may be configured to project the image towards the eye with a focus tuned for near vision.

In such embodiment, the image projected to the eye of the user is seen by the user only when the user is looking down. In other words, the image is projected in a lower part of the ophthalmic lens 110.

Advantageously, such embodiment allows the user to do not be distracted by the projected image. Such embodiment is particularly advantageous when a user is carrying on an activity, such as driving a car.

According to another embodiment of the invention, the projector 1 may be arranged in an upper part of the ophthalmic lens 110. In particular, in such embodiment, the projector 1 may be configured to project the image towards the eye with a focus tuned for far vision.

For a double piece projector, the linear array 10 may be placed horizontally along the upper edge of the ophthalmic lens 110, as represented in FIG. 4, and the scanning mean 40 may be place around the middle of the ophthalmic lens 110. In particular, the light conducting element 60 may be placed between the linear array 10 and the scanning mean 40, in the upper part of the ophthalmic lens 110. The scanning mean may be placed in front of the field of view of the user. In such embodiment, the scanning mean may be configured to move the light beam emitted by the linear array 10 directly on the direction of the eye of the user.

According to a further embodiment of the invention, the projector 1 may be placed around the middle of the ophthalmic lens 110. In particular, a projector 1 may comprise scanning mean 40 comprising a MEMS mirror so as to direct the light beam on the direction of the eye of the user to display the image. More precisely, the MEMS mirror may be placed in front of the eye of the user without causing discomfort to the user.

For instance, such scanning mean 40 may be about 1 mm, and thus may be integrated in the ophthalmic lens 110 of the head mounted device 100 with transparent connection wires, such as transparent conducting films, or silver nanowires, or any transparent plastic electronic technology used to connect such scanning mean 40 in the middle of an ophthalmic lens 110. Such embodiment is particularly advantageous for augmented reality applications.

The projector may be removable attachable to a portable device, such as a wrist mounted device, or a mobile phone, or a head mounted device.

For instance, a wrist sensing device, such as a watch, may comprise the projector. The projector may be located in a frame of the wrist sensing device and configured to project an image towards a surface reflecting light towards an eye of a user or towards an eye of the user.

For instance, the projector may be located in an empty frame of a watch and configured to project the time of the day directly towards the skin of the user under the projector and surrounded by the empty frame.

The removable projector may be arranged on a head mounted device, such as on a spectacle frame. The head mounted device may comprise a connector connected to the removable projector and an optical element intended to be worn near to the eye of the user of the head mounted device. The optical element may be a transparent display on which an image may be projected by the removable projector. The connector may connect the projector to a command module arranged removable or not on the head mounted device.

The removable projector may be comprised in a mobile phone and configured for projecting an image instead of displaying such image on the screen of the mobile phone. For instance, since the projector is removable, the projector may be removed from the mobile phone and worn near the eye of the user, or may be used for projecting an image towards a surface at near distance reflecting light towards an eye of the user, or may be used as a standard screen.

The projector may be a thin and transparent micro-display easily integrated into a head mounted device. The projector may also be used as a wrist display device, for instance a watch display, for multifunction display.

The projector may comprise a linear array of light sources emitting a light beam and a scanning mean configured to circularly move the light beam. The circular movement of the scanning mean allows obtaining a circular display.

The linear array of light sources allows making a thin one-axe display, configured to display on one axe when the scanning mean is static and to display a circular image when the scanning mean rotates.

The light sources may be as small as 10 μm. Advantageously, a projector having such light sources allows having a better resolution of the image projected, and a small factor form allowing to integrate the display on a wrist watch or on a near to eye display.

The projector may further comprise coils and a magnet used to rotate the linear array of light sources. The coils may be placed in a circular array at the edge of the display.

The projector may comprise a connector configured to connect the linear array of light sources and a control system. The connector may transfer power supply and data to be displayed. The connector may transfer power and data with wireless transmission to the linear array of light sources. The linear array of light sources may comprise a reception antenna coupled with an emission antenna, such as a transparent emission antenna, placed on the connector. The power and data may be received by the linear array of light sources by high frequency radio signal, such as radio frequency identification (RFID) technology.

The invention has been described above with the aid of embodiments without limitation of the general inventive concept. Moreover, the embodiments of the invention may be combined without any restriction.

Many further modifications and variations will suggest themselves to those skilled in the art upon making reference to the foregoing illustrative embodiments, which are given by way of example only and which are not intended to limit the scope of the invention, that being determined solely by the appended claims.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used. Any reference signs in the claims should not be construed as limiting the scope of the invention.

The invention claimed is:

1. A portable device comprising at least a projector for projecting an image towards a surface reflecting light towards an eye of a user, the projector comprising:
   a linear array of light sources emitting a light beam, the linear array of light sources emitting at at least a first wavelength and extending in a first direction;
   a scanner configured to move the light beam on a second direction transverse to the first direction to display the image, the scanner comprising a reflecting optic configured to direct the light beam towards a surface reflecting light towards the eye of the user, the reflecting optic being movable by rotation such that a rotation of the reflecting optic causes movement of the light beam according to the second direction to display the image; and
   a controller configured to control the scanner and the light sources of the linear array,
   wherein the portable device is a head-mounted device comprising at least an optical system configured to be placed in front of an eye of a user and including a back face,
   wherein the projector is embedded into the optical system such that the image projected by the projector is transmitted through the back face of the optical system towards the eye of the user, and
   wherein the projector further comprises a light conducting element arranged and configured to guide the light beam emitted by the light sources of the linear array towards the reflecting optic.

2. The portable device according to claim 1, wherein the projector is arranged such that the linear array extends horizontally or vertically into the optical system.

3. The portable device according to claim 1, wherein the optical system is an ophthalmic lens configured to be worn by the user, the ophthalmic lens being adapted to the user.

4. The portable device according to claim 3,
   wherein the projector is arranged in a lower part of the ophthalmic lens and configured to project the image towards the eye with a focus tuned for near vision, or
   wherein the projector is arranged in an upper part of the ophthalmic lens and configured to project the image towards the eye with a focus tuned for far vision.

5. The portable device according to claim 1, wherein the scanner comprises a controllable liquid optic controlled by the controller and configured to direct the light beam to display the image.

6. The portable device according to claim 5, wherein the projector further comprises a light conducting element arranged and configured to guide the light beam emitted by the light sources of the linear array towards the controllable liquid optic.

7. The portable device according to claim 1, wherein the scanner comprises a support configured to support the linear array of light sources and being movable by rotation such that a rotation of the support causes movement of the light beam according to the second direction to display the image.

8. The portable device according to claim 1, wherein the scanner comprises at least a microelectromechanical system (MEMS).

9. The portable device according to claim 1, wherein the projector further comprises a heat dissipator.

10. The portable device according to claim 1,
wherein the linear array comprises a first line matrix of light sources emitting at the first wavelength, a second line matrix of light sources emitting at a second wavelength, and a third line matrix of light sources emitting a third wavelength, and
wherein the first wavelength, the second wavelength, and the third wavelength are different from one another.

11. The portable device according to claim 10, wherein the first line matrix comprises red diodes, the second line matrix comprises blue diodes, and the third line matrix comprises green diodes.

\* \* \* \* \*